United States Patent [19]

Kjarsgaard

[11] 3,972,356

[45] Aug. 3, 1976

[54] LEAD STRAIGHTENING, ALIGNING, AND SPACING IMPLEMENT FOR AN ELECTRONIC SEMI-CONDUCTOR PACKAGE

[76] Inventor: Torben Kjarsgaard, 15045 Saticoy, No. 138, Van Nuys, Calif. 91407

[22] Filed: Sept. 23, 1974

[21] Appl. No.: 508,075

[52] U.S. Cl. .......................... 140/147; 29/203 DT; 29/203 HT; 29/569 R; 29/626; 72/DIG. 10
[51] Int. Cl.² ............................................. B21F 1/02
[58] Field of Search ......... 29/626, 589, 569, 203 D, 29/203 DT, 203 H, 203 HT, 203 HM, 203 P; 140/147; 72/DIG. 10

[56] References Cited
UNITED STATES PATENTS

| | | | |
|---|---|---|---|
| 3,321,825 | 5/1967 | Cooke | 140/147 |
| 3,447,224 | 6/1969 | Helda | 140/147 |
| 3,581,549 | 6/1971 | Nakamura et al. | 140/147 |
| 3,634,571 | 1/1972 | Klepp et al. | 29/203 P |

*Primary Examiner*—Carl E. Hall
*Attorney, Agent, or Firm*—Boniard I. Brown

[57] ABSTRACT

A combination lead straightening, lead aligning, and dielectric spacing implement for a semi-conductor package of the so-called TO (transistor outline) type. The implement has a generally annular body with hook-like formations or fingers spaced about the perimeter of and projecting into the body opening in a manner such that the implement may be installed on a semi-conductor package by inserting its leads through the body opening in the regions between the fingers and then rotating the body relative to the leads to engage the fingers in gripping relation about the leads. The leads are straightened by sliding the implement along the leads and are aligned with lead receiving holes in a circuit board or other mounting base for insertion into the holes by seating the implement on the base with its fingers aligned with the holes. The implement may be left on the leads of the semi-conductor package after installation on the base to space and insulate the body or can of the package from the base.

6 Claims, 9 Drawing Figures

LEAD STRAIGHTENING, ALIGNING, AND SPACING IMPLEMENT FOR AN ELECTRONIC SEMI-CONDUCTOR PACKAGE

BACKGROUND OF THE INVENTION

1. Field of the Invention:

This invention relates generally to semi-conductor packages of the so-called TO (transistor outline) type and more particularly to a combination lead straightening, lead aligning, and dielectric spacing implement for such packages.

2. Discussion of the Prior Art:

Semi-conductor packages of the TO type are well known and widely used in the electronics industry. Accordingly, it is unnecessary to describe such packages in elaborate detail. Suffice it to say, that semi-conductor packages assume a variety of electronic forms, i.e., transistors, integrated circuits, etc., and are characterized by a relatively small, generally cylindrical body or can containing the semi-conductor and other circuit elements and a group of normally generally parallel, combination mounting and terminal leads extending from the base of the can. Such a semi-conductor package is installed on a circuit board or other mounting base by inserting the leads through receiving socket-like holes in the base and soldering, welding, brazing or otherwise electrically joining the leads to circuit elements on the base.

This installation procedure presents certain problems to which this invention is addressed. First, installation of a semi-conductor package on a mounting base requires each lead to be somehow aligned with its respective receiving hole in the base. This requirement is two-fold in nature. That is, the leads must be straightened, if bent, and even after straightening, each lead must generally be physically aligned with its receiving hole. With regard to the lead straightening requirement, the leads of a semi-conductor package are relative slender wires which are commonly bent in storage and handling and hence generally require straightening.

A variety of lead straightening and lead aligning techniques and implements have been devised. Examples of these are described in U.S. Pat. Nos. 2,573,198; 2,696,746; 3,349,813; 3,447,224, and 3,520,336. In some cases, alignment of the leads with their receiving holes in a mounting base is accomplished with tweezers.

Installation of semi-conductor packages may also require spacing or spacing and insulation of the package can from the mounting base. Some of the prior art lead aligning and straightening implements are capable of this spacing and insulating function as well.

SUMMARY OF THE INVENTION

This invention provides an improved combination lead straightening, aligning and dielectric spacing implement for semi-conductor packages of the class described which is characterized by its ease of installation on and removal from the package leads.

The implement has a generally annular body with an opening for receiving the leads endwise and generally curved hook or finger-like formations spaced about the perimeter of and projecting into the body opening. For convenience, these formations are referred to simply as fingers in the ensuing description. The fingers have edges which face in the same circumferential direction of the opening perimeter and recesses which face in the latter direction through the finger edges. These recesses are sized and shaped to receive the leads of a semi-conductor package by entrance of the leads laterally of their length into the recess and with essentially a snap fit, such that the fingers grip the leads with a snug sliding fit. The fingers are flexible to some degree to permit entrance of the leads into the recesses. The number of fingers equals the number of leads on the semi-conductor package on which the implement is to be used and the arrangement and spacing of the fingers corresponds to the arrangement and spacing of the leads.

The implement is installed on the leads of a semi-conductor package by inserting the leads endwise through the opening in the implement body in the regions between the implement fingers and to a position where the implement is located at the base ends of the leads, that is, adjacent the package can. The implement and package are then rotated relative to one another to cause the leads to enter the finger recesses or, stated another way, to cause the fingers to enter into gripping engagement about the leads.

After assembly of the implement on the package leads, the latter are straightened by relative movement of the package and implement lengthwise of the leads to effect movement of the implement along the leads and thereby bend the latter back to their normal straight and generally parallel configuration. Alignment of the leads with their receiving holes in a mounting base is accomplished by positioning the implement at the tip ends of the leads and seating the implement against the mounting base with the holes and implement finger recesses aligned. The leads are then pushed through the implement into the aligned base holes. If desired, the implement may remain on the leads to space the can of the semi-conductor package from the mounting base or both space and insulate the can from the base.

DESCRIPTION OF THE PREFERRED EMBODIMENT

Figure 1:
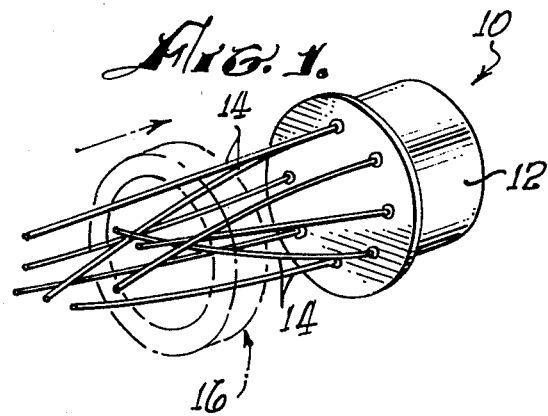
FIG. 1 is a perspective view of a semi-conductor package with a present implement, shown in broken lines, installed on its leads.
Figure 7:
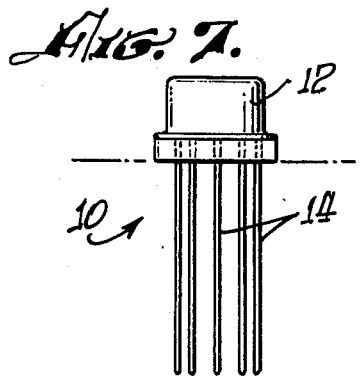
FIG. 7 illustrates a typical semi-conductor package with straightened leads.
Figure 6:
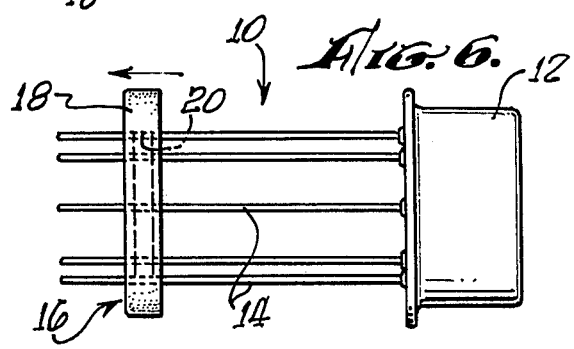
FIG. 6 illustrates the manner of using the implement to straighten leads.

In FIGS. 1, 6 and 7, reference numeral 10 denotes a typical TO semi-conductor package. This package has a body or can 12 containing the semi-conductor and other circuit elements and a group of normally generally parallel, combination mounting and terminal leads 14 extending from the base of the can. As noted earlier, the package may assume various electronic forms, such as a transistor, integrated circuit, or the like. In use, the package leads 14 are inserted into receiving holes in a circuit board or other mounting base (not shown) and are then soldered, welded, brazed or otherwise electrically joined to circuit elements on the base.

To permit mounting of the package on the base, it is necessary that the leads 14 be in their normal generally parallel relation shown in FIG. 7, or at least be aligned with their receiving holes in the base. As is well known to those versed in the art, however, the leads are quite slender and prone to being bent in handling. FIG. 1, for example, shows package leads as they typically exist prior to straightening for assembly on a mounting base. Moreover, it is often necessary to install a semi-conductor package with its can 12 spaced and/or spaced and insulated from the mounting base.

Figure 2:
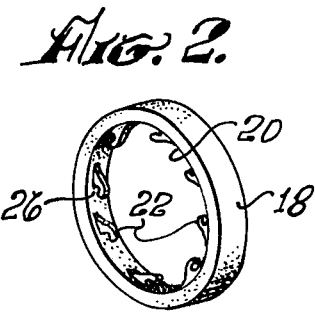
FIG. 2 is a perspective view of the implement.
Figure 3:
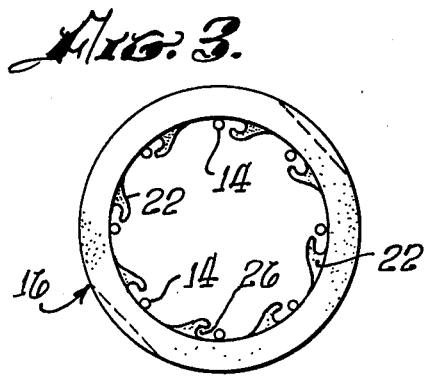
FIGS. 3 and 4 are plan views of the implement illustrating its manner of engagement with the package leads.
Figure 4:
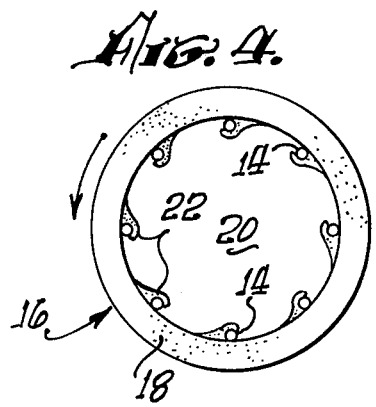

FIGS. 2–4 illustrate a combination lead straightening, lead aligning, and dielectric spacing implement 16 according to the invention which may be used to restore the leads 14 to their parallel condition of FIG. 7, align the leads with their base holes during installation, and spacing or both spacing and insulating the package can 12 from the mounting base. Implement 16 has an annular body 18, in this instance a flat ring-shaped body, with a central opening 20 for receiving the leads 14 by axial insertion of the latter through the opening or insertion of the body over the leads, in the manner illustrated in FIG. 1. Spaced about the perimeter of and projecting into the body opening 20 are a number of generally hook-like fingers 22. These fingers are equal in number to the leads 14 of the semi-conductor package 10 and have the same general arrangement and spacing as the leads in their normal straight configuration.

Fingers 22 have edges facing in the same circumferential direction about the perimeter of the body opening 20. Opening in the latter direction through these edges are recesses 26 which are sized and shaped to receive the semi-conductor package leads 14 with a snap fit, such that when the leads are positioned in the recesses, the fingers effectively grip the leads, i.e., surround more than 180° of each lead. The fingers are made sufficiently resilient to enable the leads to enter and also retract from the finger recess. The particular implement shown, for example, may be injection molded in one piece from a suitable plastic which renders the fingers sufficiently flexible for the purpose mentioned.

In use of the implement 16, the latter is placed on the leads 14 in the manner explained earlier and illustrated in FIG. 1. The implement is initially positioned at the base ends of the leads, adjacent the can 12 of the semi-conductor package 10, where the leads though bent have their normal arrangement and spacing. The leads are initially situated within the regions between the fingers 22, as shown in FIG. 3. The semi-conductor package 10 and implement 16 are then rotated relative to one another in a manner such that the rotation of the implement with respect to the leads 14 occurs in the direction in which the finger recesses 26 open, as indicated by the arrow in FIG. 4.

This relative rotation of the implement effects relative lateral movement of the leads 14 into the recesses to their final positions of FIG. 4 in the closed ends of the recesses. The leads may then be straightened by moving the implement and package relative to one another, lengthwise of the leads, such that the relative movement of the implement occurs along the leads to straighten the latter, as shown in FIG. 6.

Figure 5:
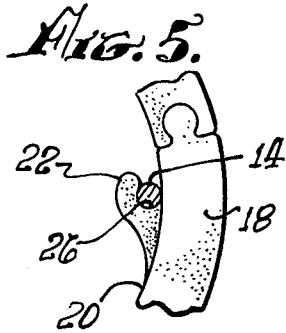
FIG. 5 is an enlarged fragmentary view of a modified implement.

Alignment of the leads with receiving holes in a circuit board or the like may be accomplished by sliding the implement to the tip ends of the leads and aligning the fingers 22 with the holes, such that the leads are guided directly into their holes during installation of the semi-conductor package on the mounting base. The implement may be left on the leads to serve permanently as a spacer and/or insulator. When used as a lead straightener prior to installation of the can leads into the circuit board, the implement is removed by sliding it off the ends of the wires. The implement may be used as a spacer during installation, and thereafter removed. Removal is accomplished by reverse rotation of the implement relative to the leads and would require the implement to be split, as shown in FIG. 5.

Figure 8:
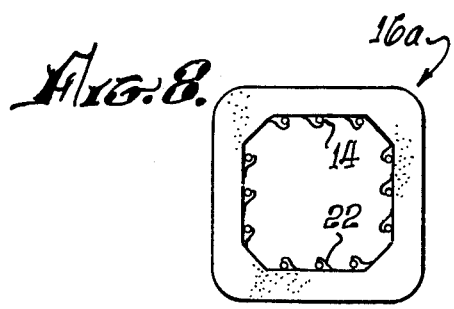
FIGS. 8 and 9 illustrate modified implements according to the invention.
Figure 9:
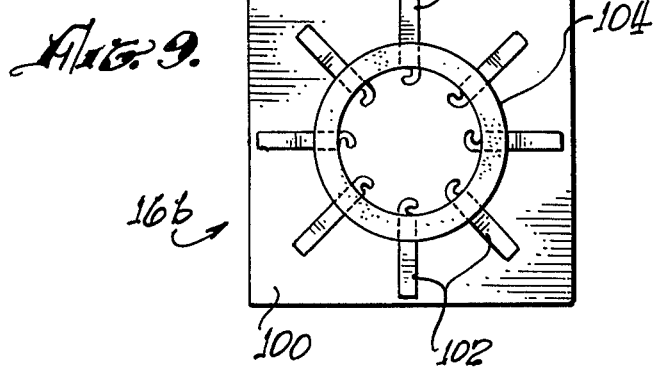

FIGS. 8 and 9 illustrate modified lead straightening, aligning, and spacing implements 16a and 16b according to the invention. Implement 16a is similar to implement 16 except that the former has a rectangular shape. Either of the implements of FIGS. 2 and 8 may be split and releasably joined at its split ends as shown in FIG. 5 for ease of fabrication and/or removal from leads when a spacer/insulator is not needed between the board and can assembly; that is, the implement of FIG. 5 may be counter rotated, opened, and removed from the leads after assembly.

The implement 16b of FIG. 9 is a semi-conductor test fixture, wherein the fingers 102 may be formed in a metal lead frame and are encapsulated and secured in position by molding the plastic, non-conductive ring 104 over them. After the fingers are separated from the lead frame they are connected to a printed circuit board by welding, brazing, or soldering. Loading of semi-conductors in this test jig is accomplished in the same manner as with the embodiment hereinbefore described.

The fingers 102 are preferably fabricated of metal or other conductive materials, thus to afford protection with respect to static charge by shorting the leads together, or to enable electrical testing of the semi-conductor package by applying voltage across appropriate fingers.

I claim:

1. An implement for use with a semi-conductor package having normally parallel leads extending from the package, comprising:
   a body having an opening for receiving the package leads,
   generally hook-like resilient fingers on said body about the perimeter of said opening and projecting into said opening, and
   said fingers having edges facing in the same circumferential direction of said perimeter and recesses opening through said edges for receiving said leads with a snap fit, such that said implement may be assembled on said leads by inserting the latter through said body opening in the regions between said fingers, then effecting relative rotation of said implement and package about the axis of said opening in a manner such that the rotation of said implement with respect to leads occurs in said circumferential direction and said leads enter said recesses laterally and are captivated in the recesses.

2. An implement for use with a semi-conductor package having normally parallel leads extending from the package, comprising:

a body comprising a split resilient ring having an opening for receiving the package leads and means joining the ring ends, generally hook-like fingers on said body about the perimeter of said opening and projecting into said opening, and said fingers having edges facing in the same circumferential direction of said perimeter and recesses opening through said edges for receiving said leads with a relatively snug sliding fit, such that said implement may be assembled on said leads by inserting the latter through said body opening in the regions between said fingers, then effecting relative rotation of said implement and package about the axis of said opening in a manner such that the rotation of said implement with respect to leads occurs in said circumferential direction and said leads enter said recesses laterally.

3. An implement according to claim 2 wherein:
said ring end joining means is releasable.

4. An implement according to claim 2 wherein:
said fingers are resilient and said finger recesses are sized and shaped to receive said leads with a snap fit, such that when said implement is assembled on said leads, the latter are captivated in said recesses.

5. An implement for use with a semi-conductor package having normally parallel leads extending from the package, comprising:

an electrically dielectric body having an opening for receiving the package leads, fingers on said body about the perimeter of said opening having hook-like inner ends projecting into said opening and outer ends accessible at the outer perimeter of said body for connection to external electrical circuit means, said inner finger ends having edges facing in the same circumferential direction of said perimeter and recesses opening through said edges for receiving said leads with a relatively snug sliding fit, such that said implement may be assembled on said leads by inserting the latter through said body opening in the regions between said fingers, then effecting relative rotation of said implement and package about the axis of said opening in a manner such that the rotation of said implement with respect to leads occurs in said circumferential direction and said leads enter said recesses laterally, and said fingers being resilient and said finger recesses being sized and shaped to receive said leads with a snap fit, such that when said implement is assembled on said leads, the latter are captivated in said recesses.

6. An implement according to claim 5 wherein:
said body is a molded body encapsulating said fingers.

* * * * *